United States Patent [19]
Beele

[11] Patent Number: 6,127,048
[45] Date of Patent: Oct. 3, 2000

[54] ARTICLE OF MANUFACTURE HAVING A METAL SUBSTRATE WITH AN OXIDE LAYER AND AN IMPROVED ANCHORING LAYER AND METHOD OF BONDING THE SAME

[75] Inventor: Wolfram Beele, Ratingen, Germany

[73] Assignee: Siemens Aktiengesellschaft, Munich, Germany

[21] Appl. No.: 09/237,172

[22] Filed: Jan. 25, 1999

Related U.S. Application Data

[63] Continuation of application No. PCT/EP96/03287, Jul. 25, 1996.

[51] Int. Cl.$^7$ ................................ B23B 15/04; F01D 5/28
[52] U.S. Cl. ..................... 428/623; 428/633; 428/668; 428/678; 428/680; 428/469; 428/472; 428/701; 428/702; 416/241 B
[58] Field of Search ...................... 428/623, 627, 428/628, 629, 633, 678, 668, 680, 469, 472, 701, 702; 416/241 B

[56] References Cited

U.S. PATENT DOCUMENTS

| | | |
|---|---|---|
| 4,055,705 | 10/1977 | Stecura et al. . |
| 4,321,310 | 3/1982 | Ulion et al. . |
| 4,321,311 | 3/1982 | Strangman . |
| 5,087,477 | 2/1992 | Giggins, Jr. et al. . |
| 5,154,855 | 10/1992 | Sekiguchi et al. . |
| 5,238,752 | 8/1993 | Duderstadt et al. . |
| 5,262,245 | 11/1993 | Ulion et al. . |
| 5,268,238 | 12/1993 | Czech et al. . |
| 5,273,712 | 12/1993 | Czech et al. . |
| 5,401,307 | 3/1995 | Czech et al. . |
| 5,985,467 | 11/1999 | Beele ........................................ 428/623 |

FOREIGN PATENT DOCUMENTS

| | | |
|---|---|---|
| 0 185 603 A1 | 6/1986 | European Pat. Off. . |
| 0 430 874 A1 | 6/1991 | European Pat. Off. . |
| 1500175 | 4/1966 | France . |
| 1536493 | 7/1967 | France . |

OTHER PUBLICATIONS

International Publication No. WO 86/04615 (Kvernes), dated Aug. 14, 1986.
Patent Abstracts of Japan No. 63–274751 (Noritaka et al.), dated Nov. 11, 1988.
"The development of reaction products at the interface between partially stabilized zirconia and the MCrAlY bond coat in thermal barrier coatings" (Lee et al.), 1075 Revue de Metallurgie, No. 5, May 1991, Paris.

Primary Examiner—Timothy M. Speer
Assistant Examiner—Bryant Young
Attorney, Agent, or Firm—Herbert L. Lerner; Laurence A. Greenberg; Werner H. Stemer

[57] ABSTRACT

An article of manufacture includes a substrate and an anchoring layer disposed on a surface of the substrate. The substrate is capable of developing a first oxide on the surface which is tightly bonded thereto and includes a first metallic element. Alternatively, the surface is formed of the first oxide. The anchoring layer is formed with a ternary oxide of the first metallic element, a second metallic element and oxygen. A second oxide layer, which contains an oxide of the second metallic element, is disposed on the anchoring layer. The anchoring layer is formed on the substrate in a series of process steps, which include: establishing an atmosphere containing oxygen around the article; evaporating a compound of the first metallic element and a compound of the second metallic element into the atmosphere and forming a ternary gas phase containing the first metallic element, the second metallic element and the oxygen; and precipitating the ternary gas phase on the article.

32 Claims, 1 Drawing Sheet

ARTICLE OF MANUFACTURE HAVING A METAL SUBSTRATE WITH AN OXIDE LAYER AND AN IMPROVED ANCHORING LAYER AND METHOD OF BONDING THE SAME

CROSS-REFERENCE TO RELATED APPLICATION

This application is a continuation of International Application No. PCT/EP96/03287, filed Jul. 25, 1996, which designated the United States.

BACKGROUND OF THE INVENTION

Field of the Invention

The invention relates to an article of manufacture having a metal substrate, an oxide layer and an anchoring layer disposed therebetween. More specifically, the invention relates to a superalloy substrate, a thermal barrier layer and a layer anchoring the thermal barrier layer onto the substrate. The invention also relates to a method for bonding the article of manufacture, the oxide layer and the anchoring layer.

U.S. Pat. No. 4,055,705 to Stecura et al.; U.S. Pat. No. 4,321,310 to Ulion et al.; and U.S. Pat. No. 4,321,311 to Strangman disclose coating systems for gas turbine components made from nickel or cobalt-based superalloys. A coating system described therein includes a thermal barrier layer made from ceramic, which in particular has a columnar grained structure, that is placed on a bonding layer or bond coating which in turn is placed on the substrate and bonds the thermal barrier layer to the substrate. The bonding layer is made from an alloy of the MCrAlY type, namely an alloy containing chromium, aluminum and a rare earth metal such as yttrium in a base including at least one of iron, cobalt and nickel. Further elements can also be present in an MCrAlY alloy, with examples being given below. An important feature of the bonding layer is that a thin oxide layer of alumina or a mixture of alumina and chromium oxide, depending on particulars of the composition of the MCrAlY alloy, inter alia, is developed on the MCrAlY alloy in an oxidizing environment below the thermal barrier layer.

Accordingly, a bond between the thermal barrier layer and the alumina layer must be provided.

U.S. Pat. No. 5,238,752 to Duderstadt et al. discloses a coating system for a gas turbine component which also incorporates a ceramic thermal barrier layer and a bonding layer bonding the thermal barrier layer to the substrate. The bonding layer is made from an intermetallic aluminide compound, in particular a nickel aluminide or a platinum aluminide. The bonding layer also has a thin oxide layer which must serve to anchor the thermal barrier layer.

U.S. Pat. No. 5,262,245 to Ulion et al. describes a result of an effort to simplify coating systems incorporating thermal barrier layers for gas turbine components by avoiding bonding layers. To that end, a composition for a superalloy is disclosed which may be used to form a substrate of a gas turbine component and which develops an alumina layer on its outer surfaces under a suitable treatment. That alumina layer is used to anchor a ceramic thermal barrier layer directly on the substrate, eliminating the need for a special bonding layer to be placed between the substrate and the thermal barrier layer.

U.S. Pat. No. 5,087,477 to Giggins et al. shows a method for placing a ceramic thermal barrier layer on a gas turbine component by a physical vapor deposition process. That process includes establishing an atmosphere having a controlled content of oxygen at the component to receive the thermal barrier layer, evaporating compounds with an electron beam and forming a gas phase, and precipitating the gas phase on the compound to form the thermal barrier layer.

U.S. Pat. Nos. 5,154,885; 5,268,238; 5,273,712; and 5,401,307 to Czech et al. disclose advanced coating systems for gas turbine components including protective coatings of MCrAlY alloys. The MCrAlY alloys disclosed therein have carefully balanced compositions in order to provide exceptionally good resistance to corrosion and to oxidation, as well as an exceptionally good compatibility (mechanical, chemical) to the superalloys used for the substrates. The basis of the MCrAlY alloys is formed by nickel and/or cobalt. Additions of further elements, in particular silicon and rhenium, are also discussed. Rhenium in particular is shown to be a very advantageous additive. All MCrAlY alloys shown are also very suitable as bonding layers for anchoring thermal barrier layers on gas turbine components. U.S. Pat. No. 5,401,307 also contains a survey of compositions of superalloys which are useful for forming gas turbine components.

A standard practice in bonding an oxide layer, in particular a thermal barrier layer, to an article of manufacture, is placing an anchoring layer formed of alumina on the article, either by placing a suitable bonding layer on the article which develops the alumina on its surface under oxidizing conditions or by selecting a material for the article which is itself capable of developing alumina on its surface. The thermal barrier layer is placed on the bonding layer and bonded to the substrate through the anchoring layer.

The thermal barrier layer itself is expediently made from an oxide ceramic, particularly stabilized or partly stabilized zirconia. "Partly Stabilized Zirconia" classifies a family of preparations containing zirconia as a principal constituent and at least one other compound which is thoroughly mixed with the zirconia and which inhibits the zirconia to change its crystalline properties under thermal cycling. Examples of such other compounds are yttria, calcia, magnesia, ceria and lanthana. In order to produce the desired effect, those other compounds have to be admixed to the zirconia in amounts up to 10 percent by weight or even more. Examples are available from the cited documents of the state of the art.

Particulars of the bonding of the thermal barrier layer to an anchoring layer formed essentially of alumina have not yet attained considerable recognition or even discussion from the technicians working in the field. It has more or less been taken for granted that the alumina, being a ceramic itself and being developed as a layer bonded to a suitable metal substrate, would assure bonding between the metal substrate and a thermal barrier layer placed upon the alumina by its mere existence. Heretofore, only an alumina layer has been given consideration to anchor a thermal barrier layer on a superalloy substrate regardless of its declining bonding capability and increasing spalling probability as it grows during operation due to the exposure to an oxidizing environment. Such growth must be expected to occur at a gas turbine component under high thermal load in an oxidizing environment.

Further inquiries by the inventor have revealed that it is not the mere existence of an alumina anchoring layer which bonds a thermal barrier layer placed thereon thereto, but that it is a solid state chemical reaction occurring between the alumina and the thermal barrier layer which creates a thin mixing zone between the anchoring layer and the thermal barrier layer where compounds formed from both the anchoring layer and the thermal barrier layer provide for bonding.

SUMMARY OF THE INVENTION

It is accordingly an object of the invention to provide an article of manufacture having a metal substrate with an oxide layer and an improved anchoring layer and a method of bonding the same, which overcome the hereinaforementioned disadvantages of the heretofore-known articles and methods of this general type and which improve the bonding of the oxide layer, particularly a ceramic thermal barrier layer, to a substrate through an anchoring layer by modifying the anchoring layer in a suitable manner.

With the foregoing and other objects in view there is provided, in accordance with the invention, an article of manufacture, comprising a metal substrate having a surface, the metal substrate capable of developing a first oxide layer disposed on and tightly bonded to the surface, the first oxide layer including a first metallic element; an anchoring layer disposed on the surface, the anchoring layer including a ternary oxide formed with the first metallic element, a second metallic element and oxygen; and a second oxide layer disposed on the anchoring layer, the second oxide layer containing an oxide of the second metallic element.

With the objects of the invention in view there is also provided an article of manufacture, comprising a substrate having a surface formed by a first oxide including a first metallic element; an anchoring layer disposed on the surface, the anchoring layer including a ternary oxide formed with the first metallic element, a second metallic element and oxygen; and a second oxide layer disposed on the anchoring layer and bonded to the surface by the anchoring layer, the second oxide layer containing an oxide of the second metallic element.

In accordance with an added feature of the invention, the anchoring layer includes the ternary oxide as a principal constituent, or it is formed essentially of the ternary oxide. The term "principal constituent" is understood to refer to a composition of matter wherein the component mentioned is present in an amount exceeding 50%, as measured in parts by weight.

In accordance with another feature of the invention, the ternary oxide is selected from the group formed of spinels, pyrochlores and perovskites. These three terms specify ternary oxides by their composition as well as by their cristallographic structure. Particularly, a spinel has a chemical composition $AB_2O_4$, a pyrochlore has a composition $B_2C_2O_7$ and a perovskite has a composition $ABO_3$. Therein, A denotes a divalent metal, B denotes a trivalent metal, C denotes a tetravalent metal and O denotes oxygen. Examples of spinels and pyrochlores are $YbAl_2O_4$, $MgAl_2O_4$, $CaAl_2O_4$ and $Al_2Zr_2O_7$. All ternary oxides mentioned explicitly or by a general formula are known as such.

In accordance with an additional feature of the invention, the second metallic element is zirconium, the second oxide layer may contain zirconia as a principal constituent, and particularly, the second oxide layer is formed essentially of a partly stabilized zirconia. In this context, it is particularly preferred that the first metallic element is aluminum, and that the ternary oxide is a pyrochlore formed of aluminum, zirconium and oxygen. A major motive for this preference is the fact that the pyrochlore formed of aluminum, zirconium and oxygen has been observed to occur at a boundary between a layer of alumina and a layer of zirconia and indeed provides for the bonding between these two compounds. Accordingly, the provision of an anchoring layer formed of that pyrochlore can be expected to provide good bonding properties as experienced within the prior art and will be reliably preserved even if additional alumina is formed between the anchoring layer and the substrate, as must be expected for an article that serves as a gas turbine component under heavy load.

In accordance with a further feature of the invention, the anchoring layer is doped with nitrogen, preferably in an amount between 1 and 10 atom percent.

In accordance with again an additional feature of the invention, the substrate is formed of a nickel or cobalt-based superalloy.

In accordance with yet an added feature of the invention, a bonding layer is interposed between the substrate and the anchoring layer. The bonding layer is preferably formed of a material selected from the group formed of metal aluminides and MCrAlY alloys, and it has a preferable thickness of less than 25 micrometers.

In accordance with a further feature of the invention, in a preferred embodiment, the substrate, the anchoring layer and the second oxide layer together form a gas turbine component. Such a component includes, in particular, a mounting portion for holding the component in operation and an active portion subject to a hot gas stream streaming along the component in operation. The active portion is at least partly covered by the anchoring layer and the second oxide layer. The component may, in particular, be formed as a blade, a vane or a heat shield part.

With the objects of the invention in view there is additionally provided a bonding method, which comprises providing an article of manufacture formed of a metal substrate having a surface, the metal substrate capable of developing a first oxide layer tightly bonded to the surface and including a first metallic element; providing a second oxide layer including a second metallic element; placing an anchoring layer on the surface, the anchoring layer including a ternary oxide formed with the first metallic element, the second metallic element and oxygen; placing the second oxide layer on the anchoring layer; and bonding the second oxide layer to the substrate through the anchoring layer.

With the objects of the invention in view there is furthermore provided a bonding method, which comprises providing an article of manufacture formed of a substrate having a surface formed by a first oxide layer including a first metallic element; providing a second oxide layer including a second metallic element; placing an anchoring layer on the surface, the anchoring layer including a ternary oxide formed with the first metallic element, the second metallic element and oxygen; placing the second oxide layer on the anchoring layer; and bonding the second oxide layer to the substrate through the anchoring layer.

In accordance with an added mode of the invention, the step of bonding the second oxide layer to the substrate is effected by subjecting the substrate with the various layers placed thereon to a suitably selected elevated temperature. Thereby, solid state chemical reactions are effected at respective boundaries between a layer and the substrate or between two layers, creating the desired bonds. Eventually, that step of subjecting to the elevated temperature can be performed concurrently with the step of placing the second oxide layer.

In accordance with yet an added mode of the invention, the anchoring layer is placed by: establishing an atmosphere containing oxygen around the article; evaporating a compound of the first metallic element and a compound of the second metallic element into the atmosphere and forming a ternary gas phase containing the first metallic element, the second metallic element and the oxygen; and precipitating the ternary gas phase on the article.

In accordance with another mode of the invention, the compound of the first metallic element to be evaporated is preferably selected from the group formed of the first metallic element itself and an oxide or oxides of the first metallic element. The compound of the second metallic element is preferably an oxide of the second metallic element.

In accordance with again a further mode of the invention, at least one of the compound of the first metallic element and the compound of the second metallic element is evaporated by irradiating at least one solid target containing the respective compound, with an electron beam.

In accordance with an added mode of the invention, the step of placing the anchoring layer includes: initially establishing the atmosphere containing oxygen at a given partial pressure; and evaporating the compound of the first metallic element and the compound of the second metallic element, forming the ternary gas phase and precipitating the ternary gas phase on the article while concurrently lowering the partial pressure of the oxygen in the atmosphere. The second oxide layer is then placed as follows: establishing another atmosphere containing oxygen around the article; evaporating a compound with the second metallic element and forming an oxide gas phase; precipitating the oxide gas phase on the anchoring layer; and reacting the anchoring layer with oxygen from the atmosphere and oxygen from the oxide gas phase precipitating on the anchoring layer.

In accordance with yet a further mode of the invention, the step of placing the second oxide layer includes evaporating a compound with the second metallic element and forming an oxide gas phase; and precipitating the oxide gas phase on the anchoring layer.

In accordance with a concomitant mode of the invention, the step of placing the anchoring layer includes doping the anchoring layer with nitrogen. Thereby, the anchoring layer is made an efficient diffusion barrier to prevent migration of diffusion active elements through the anchoring layer into the second oxide layer. The doping can, in particular, be performed by placing the anchoring layer by PVD or a similar process in an atmosphere containing an amount of nitrogen or by heat treating the anchoring layer after its placement in an atmosphere containing nitrogen to diffuse nitrogen into the anchoring layer.

Other features which are considered as characteristic for the invention are set forth in the appended claims.

Although the invention is illustrated and described herein as embodied in an article of manufacture having a metal substrate with an oxide layer and an improved anchoring layer and a method of bonding the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
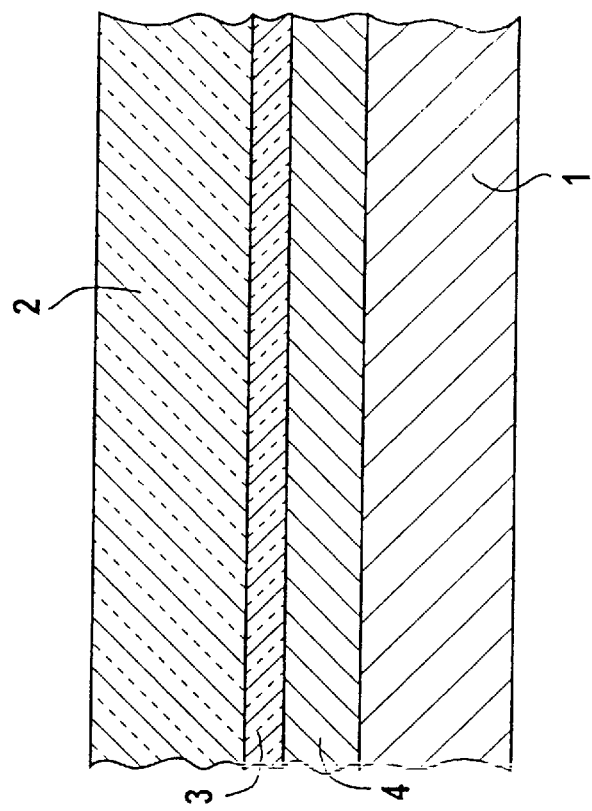
FIG. 1 is a fragmentary, diagrammatic, cross-sectional view of a substrate with a protective coating system incorporating a second oxide layer and an anchoring layer, which is taken along a line I—I of FIG. 2, in the direction of the arrows.

Referring now to the figures of the drawing in detail and first, particularly, to FIG. 1 thereof, there is seen a substrate 1 of an article of manufacture, in particular a gas turbine component, which in operation is subject to a heavy thermal load and concurrently to corrosive and erosive attack, including an attack by oxidation. The substrate 1 is formed of a material which is suitable to provide strength and structural stability when subjected to a heavy thermal load and eventually an additional mechanical load by severe forces like centrifugal forces. A material which is widely recognized and employed for such a purpose in a gas turbine engine is a nickel or cobalt-based superalloy. Preferred examples of such superalloys are a nickel-based superalloy IN738LC and a cobalt-based superalloy MAR-M 509, as specified according to common practice.

In order to limit the thermal load imposed on the substrate 1, it has a thermal barrier layer in the form of a second oxide layer 2 placed thereon. This second oxide layer 2 is made from a columnar grained oxide ceramic, in particular being formed essentially of a stabilized or partly stabilized zirconia as explained above. The second oxide layer 2 is anchored to the substrate 1 through the use of an anchoring layer 3. This anchoring layer 3 is developed on a bonding layer 4 which has to be placed on the substrate 1 priorly. The bonding layer 4 is formed of an MCrAlY alloy and preferably of an MCrAlY alloy as patented in one of U.S. Pat. Nos. 5,154,885, 5,268,238, 5,273,712 and 5,401,307. The drawing is not intended to show the thicknesses of the layers 3 and 4 to scale. The thickness of the anchoring layer 3 might in reality be very much less than the thickness of the bonding layer 4 and amount only to a few layers of atoms, as specified herein-above.

The anchoring layer 3 is formed essentially of a pyrochlore formed with a first metallic element, namely aluminum, and a second metallic element the oxide of which constitutes at least partly the second oxide layer 2, namely zirconium. That pyrochlore is chemically and crystallographically affine to the material forming the second oxide layer 2 as well as to the material forming the portion of the article located immediately below the anchoring layer 3. That portion is namely the bonding layer 4 which in turn is affine to alumina due to its capability to develop an alumina layer tightly bonded to it, or an alumina layer tightly bonded to the bonding layer 4 and developed thereon under exposure to an oxidizing environment. Thus, the anchoring layer 3 forms a preferred interface between the oxide layer 2 and the part of the article located below the anchoring layer 3. In the illustrated embodiment that part is the bonding layer 4 or an alumina layer emerging from the bonding layer 4 under oxidizing conditions.

The anchoring layer 3 can, in particular, be placed or deposited by a physical vapor deposition (PVD) process, preferably by electron beam PVD and in an oxygen-containing atmosphere. Such a process is in particular carried out while holding the substrate 1 at a temperature of about 700° C. Furthermore, it may be advantageous to place the anchoring layer 3 with an oxygen deficiency and react that anchoring layer 3 with additional oxygen during placement of the second oxide layer 2, which is then to be done in another atmosphere containing oxygen.

Most preferred is a mode of placing the anchoring layer 3 by precipitating a few layers of atoms with an almost stoichiometric composition and placing the rest of the anchoring layer 3 with an oxygen deficiency. This is expediently done by initially providing an atmosphere which is relatively rich in oxygen, preferably complying with the specification given above. The presence of oxygen in a relatively high amount gives rise to chemical reactions with the constituents of the material located immediately below the anchoring layer 3, thus providing a tight bonding of the anchoring layer 3. Subsequently, the oxygen content of the atmosphere is lowered, particularly by reducing the total pressure of the atmosphere. The oxygen deficiency in the anchoring layer 3 which thus occurs is relieved afterwards by a chemical reaction with the constituents of the second oxide layer 2 and with oxygen provided as the second oxide layer 2 that is placed. This gives a tight bond to the second oxide layer 2 as well. The thickness of the anchoring layer 3 is preferably kept below 25 micrometers ($\mu$m).

The second oxide layer 2 may be placed on the anchoring layer 3 immediately after placing the anchoring layer 3, and in particular by making use of previously used apparatus to the largest possible extent. This may apply, in particular, if the second oxide layer 2 is also placed by PVD.

The placement of the second oxide layer 2 by measures other than PVD is of course also possible. In particular, it is possible to place the second oxide layer 2 by atmospheric plasma spraying.

As a further improvement, it is also contemplated to dope the anchoring layer 3 with nitrogen, thereby providing a nitrogen content between 1 and 10 atom percent, particularly between 2 and 5 atom percent. The nitrogen provides certain slight charge imbalances and spatial distortions in the crystal lattice of the ternary oxide and thereby renders it opaque or impenetrable for other elements. Thereby, transmission of diffusion active elements like hafnium, titanium, tungsten and silicon from the substrate 1 or the bonding layer 4 into the second oxide layer 2 can be prevented. That measure is particularly suitable if the second oxide layer 2 is a zirconia compound, since almost every zirconia compound must have an admixture of a further compound to stabilize its pertinent properties. Further elements penetrating into the zirconia compound might well impart the stabilization and thus question its long term efficiency, particular when used as a thermal barrier layer. The nitrogen doping of the anchoring layer 3 is well suited to ensure a long term efficiency of the second oxide layer 2. The nitrogen doping of the anchoring layer 3 can be provided concurrently with its placement, particularly by PVD in an atmosphere which contains an efficient amount of nitrogen. In this context, all PVD processes just described are applicable, by using atmospheres containing nitrogen besides oxygen. It is also possible to dope the anchoring layer 3 after its placement, particularly by a heat treatment in an atmosphere containing an efficient amount of nitrogen and diffusing the nitrogen into the anchoring layer 3.

Figure 2:
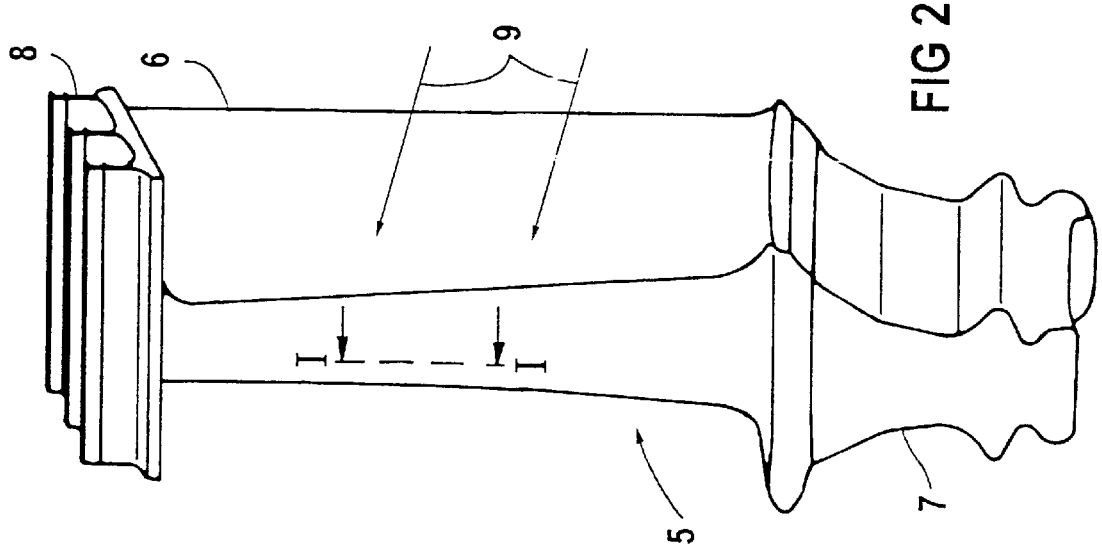
FIG. 2 is a perspective view of a gas turbine airfoil component including the substrate and the protective coating system shown in FIG. 1.

FIG. 2 shows the whole gas turbine component, namely a gas turbine airfoil component 5, in particular a turbine blade. The component 5 has an airfoil portion 6, which in operation forms an "active part" of the gas turbine engine, a mounting portion 7 at which the component 5 is fixedly held in its place, and a sealing portion 8 which forms a seal together with adjacent sealing portions of neighboring components, to prevent an escape of a gas stream 9 flowing along the airfoil portion 6 during operation.

The location of the configuration shown in FIG. 1 is indicated by a section line I—I in FIG. 2.

Referring again to FIG. 1, particular advantages of the novel combination of the anchoring layer 3 and the second oxide layer 2 can be summarized as follows: The anchoring layer 3 has a composition which has similarities to the second oxide layer 2 as well as to the bonding layer 4 and is tightly bonded to both layers by solid-state chemical reactions. It provides for a smooth and graded transition between the material of the second oxide layer 2 and an alumina layer developing between the anchoring layer 3 and the substrate 1 or the bonding layer 4 and yet retains the tight bonds provided by the solid-state reactions. The anchoring layer 3 can be deposited independently from the second oxide layer 2. oxidizing the substrate 1 or the bonding layer 4 that is eventually deposited thereon prior to putting the component into operation can be avoided, thereby lengthening the available lifetime of the component considerably. The combination of the anchoring layer 3 and the second oxide layer 2 which is thus made has all of the advantages of such combinations known from the prior art and additionally has a substantially prolonged lifetime.

I claim:

1. An article of manufacture, comprising:
   a metal substrate having a surface, said metal substrate having a first oxide layer disposed on and tightly bonded to said surface, said first oxide layer including a first metallic element;
   an anchoring layer disposed on said surface, said anchoring layer including a ternary oxide formed with said first metallic element, a second metallic element and oxygen, said ternary oxide being selected from the group consisting of spinels, pyrochlores. and perovskites; and
   a second oxide layer disposed on said anchoring layer, said second oxide layer containing an oxide of said second metallic element.

2. An article of manufacture, comprising:
   a substrate having a surface formed by a first oxide including a first metallic element;
   an anchoring layer disposed on said surface, said anchoring layer including a ternary oxide formed with said first metallic element, a second metallic element and oxygen said ternary oxide being selected from the group consisting of spinels, pyrochlores, and perovskites; and
   a second oxide layer disposed on said anchoring layer and bonded to said surface by said anchoring layer, said second oxide layer containing an oxide of said second metallic element.

3. The article according to claim 1, wherein said ternary oxide is a principal constituent of said anchoring layer.

4. The article according to claim 1, wherein said anchoring layer consists essentially of said ternary oxide.

5. The article according to claim 1, wherein said first metallic element is aluminum.

6. The article according to claim 1, wherein said second metallic element is zirconium.

7. The article according to claim 6, wherein said second oxide layer contains zirconia as a principal constituent.

8. The article according to claim 6, wherein said second oxide layer consists essentially of a partly stabilized zirconia.

9. The article according to claim 6, wherein said first metallic element is aluminum, and said ternary oxide is a pyrochlore formed of aluminum, zirconium and oxygen.

10. The article according to claim 1, wherein said anchoring layer is doped with nitrogen.

11. The article according to claim 10, wherein said nitrogen is present in said anchoring layer in an amount between 1 and 10 atom percent.

12. The article according to claim 1, wherein said substrate is formed of a nickel or cobalt-based superalloy.

13. The article according to claim 1, including a metallic bonding layer interposed between said substrate and said anchoring layer, said surface defined on said bonding layer.

14. The article according to claim 13, wherein said bonding layer is formed of a material selected from the group consisting of metal aluminides and MCrAlY alloys.

15. The article according to claim 1, wherein said anchoring layer has a thickness of less than 25 micrometers.

16. The article according to claim 1, wherein said substrate, said anchoring layer and said second oxide layer form a gas turbine component.

17. The article according to claim 16, wherein said gas turbine component includes a mounting portion for holding said component in operation and an active portion subject to a hot gas stream streaming along said component in operation, said active portion at least partly covered by said anchoring layer and said second oxide layer.

18. The article according to claim 2, wherein said ternary oxide is a principal constituent of said anchoring layer.

19. The article according to claim 2, wherein said anchoring layer consists essentially of said ternary oxide.

20. The article according to claim 2, wherein said first metallic element is aluminum.

21. The article according to claim 2, wherein said second metallic element is zirconium.

22. The article according to claim 21, wherein said second oxide layer contains zirconia as a principal constituent.

23. The article according to claim 21, wherein said second oxide layer consists essentially of a partly stabilized zirconia.

24. The article according to claim 21, wherein said first metallic element is aluminum, and said ternary oxide is a pyrochlore formed of aluminum, zirconium and oxygen.

25. The article according to claim 2, wherein said anchoring layer is doped with nitrogen.

26. The article according to claim 25, wherein said nitrogen is present in said anchoring layer in an amount between 1 and 10 atom percent.

27. The article according to claim 2, wherein said substrate is formed of a nickel or cobalt-based superalloy.

28. The article according to claim 2, including a metallic bonding layer interposed between said substrate and said anchoring layer, said surface defined on said bonding layer.

29. The article according to claim 28, wherein said bonding layer is formed of a material selected from the group consisting of metal aluminides and MCrAlY alloys.

30. The article according to claim 2, wherein said anchoring layer has a thickness of less than 25 micrometers.

31. The article according to claim 2, wherein said substrate, said anchoring layer and said second oxide layer form a gas turbine component.

32. The article according to claim 31, wherein said gas turbine component includes a mounting portion for holding said component in operation and an active portion subject to a hot gas stream streaming along said component in operation, said active portion at least partly covered by said anchoring layer and said second oxide layer.

* * * * *